United States Patent
Ma et al.

(10) Patent No.: US 12,543,545 B2
(45) Date of Patent: Feb. 3, 2026

(54) REDISTRIBUTION LAYER AND METHODS OF FABRICATION THEREOF

(71) Applicant: TAIWAN SEMICONDUCTOR MANUFACTURING COMPANY, LTD., Hsinchu (TW)

(72) Inventors: Zhen De Ma, New Taipei (TW); Chih-Pin Chiu, Hsinchu (TW); Lee-Wen Hsu, Hsinchu (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 356 days.

(21) Appl. No.: 18/235,019

(22) Filed: Aug. 17, 2023

(65) Prior Publication Data
US 2024/0355672 A1    Oct. 24, 2024

Related U.S. Application Data

(60) Provisional application No. 63/461,017, filed on Apr. 21, 2023.

(51) Int. Cl.
*H01L 21/768* (2006.01)
*H01L 23/522* (2006.01)

(52) U.S. Cl.
CPC .... *H01L 21/76829* (2013.01); *H01L 23/5226* (2013.01)

(58) Field of Classification Search
CPC .............. H01L 21/76829; H01L 23/5226
USPC .......................................................... 257/773
See application file for complete search history.

(56) References Cited

U.S. PATENT DOCUMENTS

| | | |
|---|---|---|
| 8,987,922 B2 | 3/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,372,206 B2 | 6/2016 | Wu et al. |
| 9,496,189 B2 | 11/2016 | Yu et al. |
| 11,342,408 B2 | 5/2022 | Huang et al. |
| 2019/0131232 A1* | 5/2019 | Lee ............... H01L 25/0655 |
| 2022/0130685 A1* | 4/2022 | Lee ................... H01L 24/05 |

(Continued)

FOREIGN PATENT DOCUMENTS

| | | |
|---|---|---|
| KR | 20190113484 | 10/2019 |
| KR | 20210155742 | 12/2021 |

(Continued)

*Primary Examiner* — Xia L Cross
(74) *Attorney, Agent, or Firm* — NZ Carr Law Office PLLC

(57) ABSTRACT

Embodiments of the present disclosure provide methods of forming a RDL structure with a flat passivation surface. Some embodiments provide a stop layer for chemical mechanical polishing disposed under a passivation layer. Some embodiments provide an extra thickness of passivation deposition and a sacrificial passivation layer for passivation polishing. Some embodiments provide a modified RDL pattern by inserting dummy pattern objects to adjust pattern density.

20 Claims, 21 Drawing Sheets

(56) References Cited

U.S. PATENT DOCUMENTS

2022/0310538 A1* 9/2022 Hsiao ................ H01L 24/13
2023/0139919 A1   5/2023 Hu et al.

FOREIGN PATENT DOCUMENTS

| KR | 20220025394 | 3/2022 |
| TW | 202238835 A | 10/2022 |

\* cited by examiner

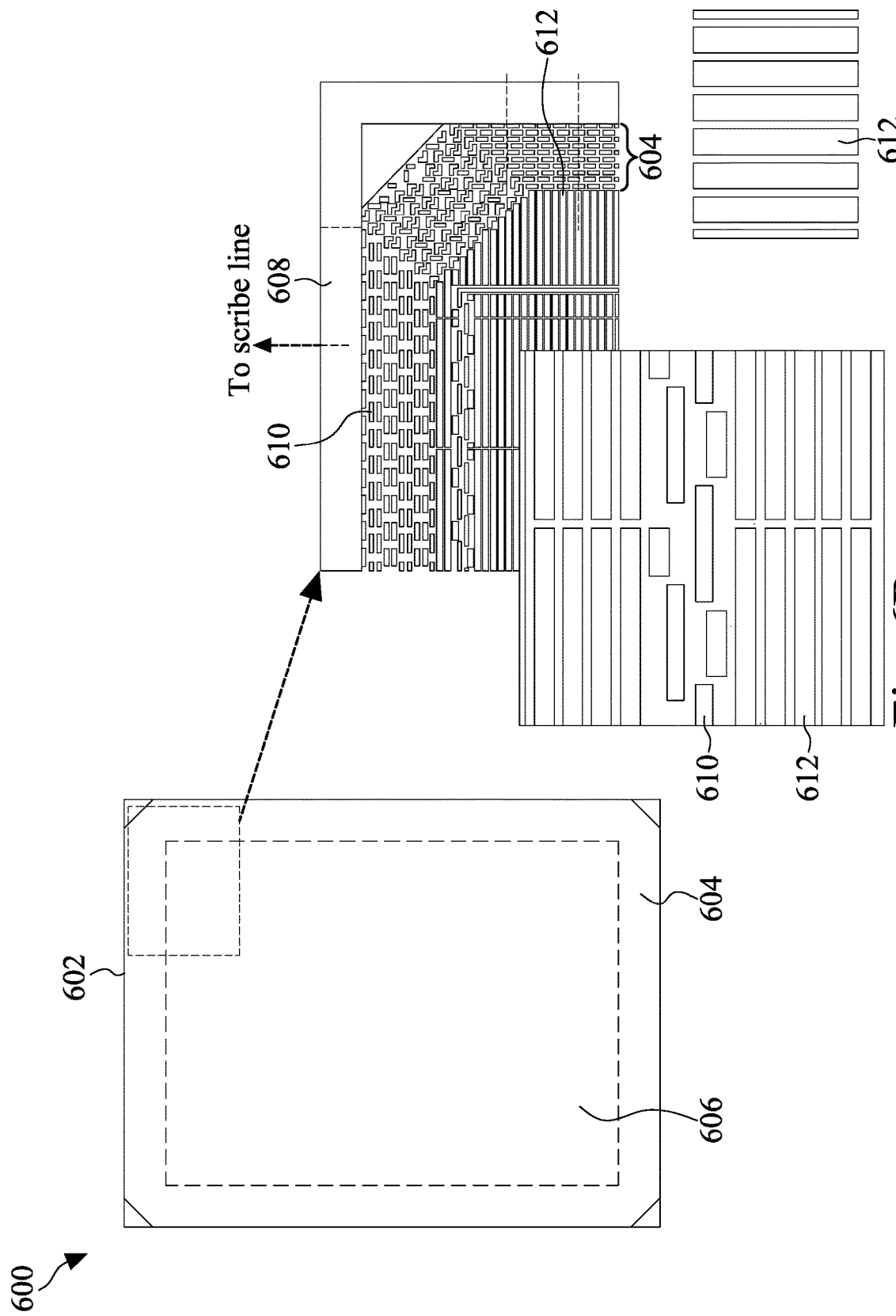

REDISTRIBUTION LAYER AND METHODS OF FABRICATION THEREOF

CROSS-REFERENCE TO RELATED APPLICATIONS

This application claims priority to the U.S. Provisional Patent Application Ser. No. 63/461,017 filed Apr. 21, 2023, which is incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially forming insulating or dielectric layers, conductive layers, and semiconductor layers of material over a semiconductor substrate to form circuit components and elements on the semiconductor substrate.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density, i.e., the number of interconnected devices per chip area, has generally increased while geometry size, i.e., the smallest component that can be created using a fabrication process, has decreased.

For example, ICs are formed on a semiconductor substrate that may be cut into individual device dies or IC chips. Each IC chip may be further attached, such as by bonding, to an interposer, a reconstituted wafer, or another die to form a package or a device. To meet various routing needs, a redistribution layer (RDL) of conductive metal lines may be formed on an IC chip to reroute bond connections from the edge to the center of the chip, or generally to disperse bond connections to an area greater than that of the IC chip. One or more passivation layers may be implemented around the RDL and additional polyimide layers may be formed over the one or more passivation layers. The passivation layers and polyimide layers are typically non-planar reflecting topographic features of the RDL.

In the course of IC evolution, flat RDL passivation surfaces are desirable for multiple RDL process and bonding capacity of system-on-integrated chip (SoIC) process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6B is a schematic plan view of a modified RDL pattern according to embodiments of the present disclosure.

DETAILED DESCRIPTION

Figure 1:
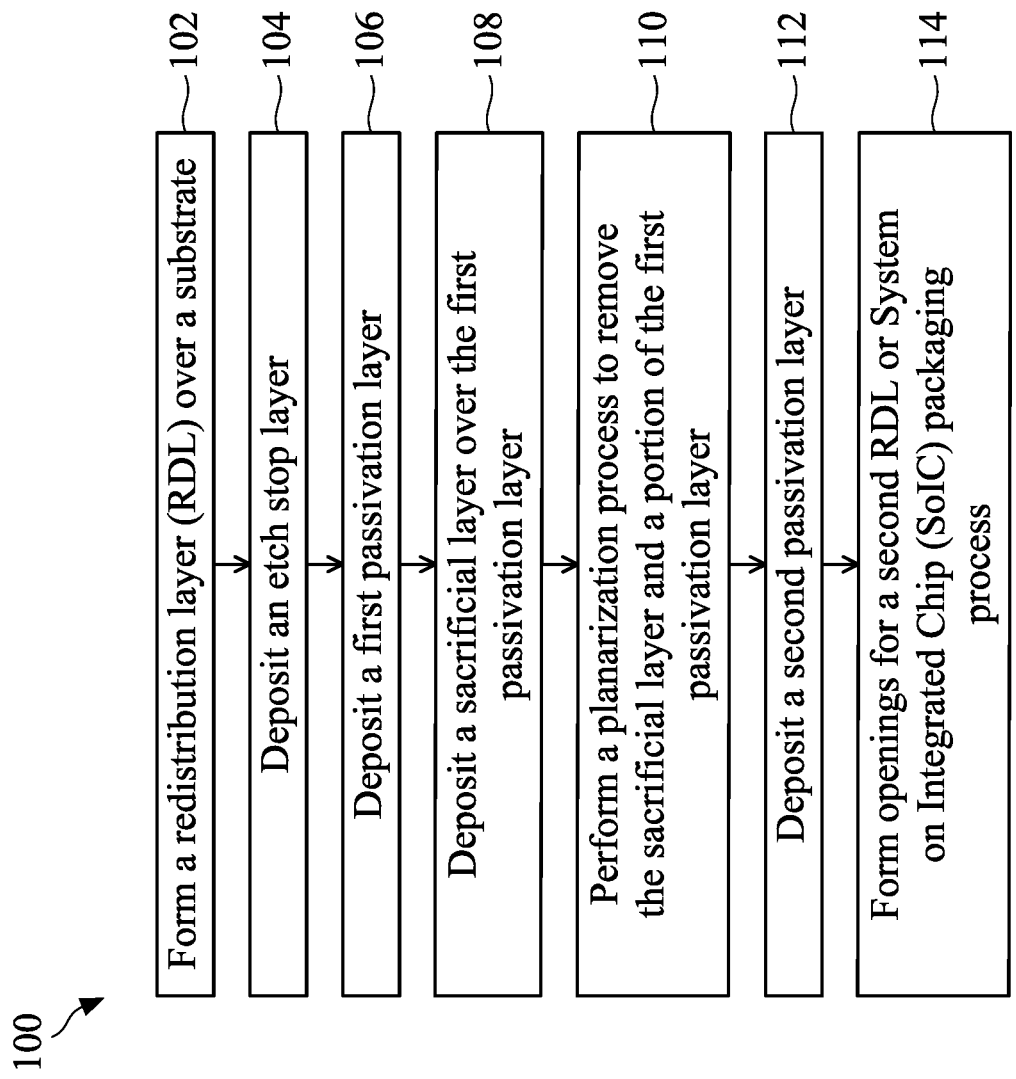
FIG. 1 is a flow chart of a method for fabricating a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

On many IC chips, a redistribution layer (RDL) of conductive metal lines is formed to reroute bond connections from the edge to the center of the chip or generally to distribute bond connections to an area larger than that of the IC chip. RDL structures are formed for multi-layer RDL design and for SoIC packaging. Some embodiments of the present disclosure provide methods of forming a RDL structure with a flat passivation surface. Some embodiments provide a stop layer for chemical mechanical polishing disposed under a passivation layer. Some embodiments provide an extra thickness of passivation deposition and a sacrificial passivation layer for passivation polishing. Some embodiments provide a modified RDL pattern by inserting dummy pattern objects to adjust pattern density.

The various aspects of the present disclosure will now be described in more detail with reference to the figures. FIG. 1 is a flow chart of a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method 100. Not all steps are described herein in detail for reasons of simplicity.

The method 100 is described below in conjunction with FIGS. 2A-2F, which are schematic cross-sectional views of a semiconductor device 200 at various stages of fabrication according to embodiments of the present disclosure.

Figure 2A:
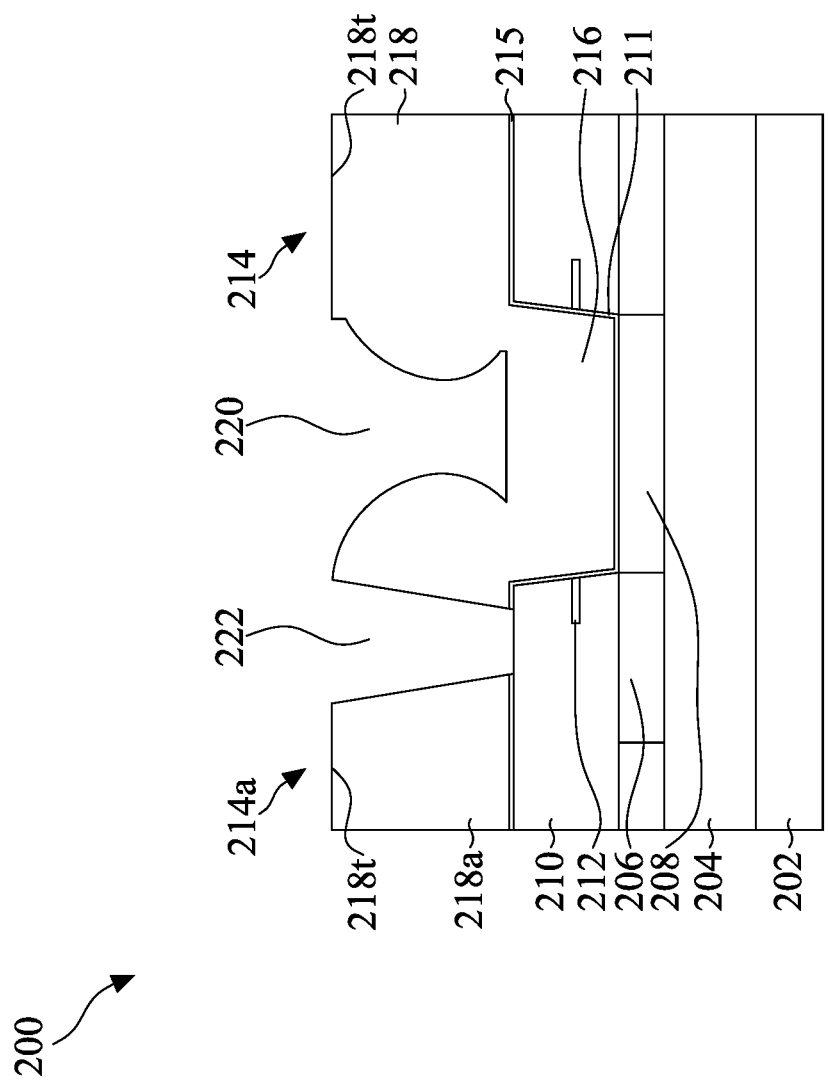
FIGS. 2A-2G are schematic cross-sectional views of a semiconductor device at various stages of fabrication according to embodiments of the present disclosure.

In operation 102 of the method 100, RDL features 214 are formed over a substrate 202, as shown in FIG. 2A. The semiconductor device 200 include the substrate 202 having various layers already formed thereon. The substrate 202 may be a bulk semiconductor substrate, a semiconductor-on-insulator (SOI) substrate, or other semiconductor substrate, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or other insulating material. The insulator layer is provided on a silicon or glass substrate. The substrate 202 may be made of silicon or other semiconductor material. For example, the substrate 202 is a silicon wafer. In some examples, the substrate 202 is made of a compound semiconductor such as silicon carbide, gallium arsenic, indium arsenide, or indium phosphide. In some examples, the substrate 202 is made of an alloy semiconductor such as GaAsP, AlInAs, AlGaAs, GaInAs, GaInP, or GaInAsP.

Various microelectronic components may be formed in or on substrate 202, such as transistor components including source/drain and/or gate, isolation structures including shallow trench isolation (STI), or any other suitable components. The electronic components may include active electronic components, such as field-effect transistors (FETs), metal-oxide-semiconductor field-effect transistors (MOSFETs), complementary metal-oxide-semiconductor (CMOS) transistors, bipolar transistors, high voltage transistors, high frequency transistors, memory cells, and/or a combination thereof. The electronic components may include passive electronic components, such as resistors, capacitors, and inductors. The electronic components may form various functional circuits, such as memory cells and logic circuits, on the substrate 202. Detailed illustrations of these various layers and features in substrate 202 are omitted.

The semiconductor device 200 also includes an interconnect structure 204. The interconnect structure 204 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the semiconductor device 200. There may be intermediate layers or components between the interconnect structure 204 and the substrate 202, but in the interest of simplicity, such layers or components are not shown. The interconnect structure 204 may include various conductive features and intermetal dielectric (IMD) layers to separate and isolate various multiple conductive components. The interconnect structure 204 includes multiple levels IMD layers with the conductive components arranged in each level to provide electrical paths to various electronic components disposed below in the substrate 202. The conductive components may include conductive vias and conductive lines. The conductive vias provide vertical electrical routing from the electronic components to the conductive features and between conductive lines in different levels. For example, the bottom-most conductive lines of the interconnect structure 204 may be electrically connected to the conductive contacts disposed over source/drain regions and gate electrode layers in transistors in the electronic components. The interconnect structure 204 may include a plurality of levels, such as five to ten levels, of the conductive vias vertically connected by the conductive lines. Dimensions of the conductive components gradually increase from lower levels, which are closer to the electronic components, to upper levels. The top most level of the conductive components are commonly referred to as top metal layer or top conductive features.

The conductive components may include contacts, vias, or metal lines. The conductive components may be made from one or more electrically conductive materials, such as metal, metal alloy, metal nitride, or silicide. For example, the conductive components are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof. In some embodiments, the conductive components at different levels are made of the same material, such as selected from a group consisting of aluminum, aluminum silicon, copper, tungsten other metals and various alloys. In one embodiment, the conductive components are all made of copper. In other embodiments, the conductive components are different levels are made of different materials. For example, the conductive components at lower levels may be formed from copper or tungsten, and the conductive components at upper levels may be formed from aluminum or aluminum alloy. The conductive components may be lined with a barrier layer formed of titanium nitride, tantalum, tantalum nitride, or combinations thereof to block diffusion of copper, aluminum and oxygen.

In some embodiments, the conductive components are formed level by level using a damascene process, such as a dual damascene process. In the dual damascene process, a via opening and a trench opening are formed in the IMD layers using two etching processes, in which the trench opening is above the via opening. The via opening and the trench opening are filled with a conductive material. Then, the conductive material outside of the trench opening is removed by a planarization process such as a chemical mechanical polishing (CMP) process to form the conductive components in the trench openings and via openings in the IMD layer.

The IMD layers may include multiple layers of dielectric materials, such as alternatively arranged interlayer dielectric layer (ILD) and etch stop layer (ESL). The ILD layers may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide). As an example, the ILD component includes silicon dioxide or a low-k dielectric material whose k-value (dielectric constant) is smaller than that of silicon dioxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. Some of the foregoing low-k dielectric materials may be referred to as extreme low-k (ELK) dielectric materials due to their low dielectric constants. The ESL layer may SiNx, SiCxNy, AlNx, AlOx, AOxNy, SiOx, SiCx, SiOxCy, or other suitable materials.

As shown in FIG. 2A, the semiconductor device 200 includes a top interconnect layer 206 having top conductors 208 formed therein. In some embodiments, the top conductors 208 in the top interconnect layer 206 may be embedded in a dielectric material similar to the ILD component described above. To improve mechanical strength, the top conductors 208 in the top interconnect layer 206 may be formed to a thickness that is greater than other metal lines in the interconnect structure 204. The top conductors 208 may include copper and aluminum. In one example, the top conductors 208 may be formed of an aluminum-copper alloy including 5% of copper and 95% of aluminum. Compared to a more conductive copper metal line, a metal line formed of the aluminum-copper alloy is more economical and adheres better to surrounding dielectric layers, such as those made of silicon oxide or silicon nitride. Although not shown, the top interconnect layer 206 may be lined with a barrier layer formed of titanium nitride, tantalum, tantalum nitride, or combinations thereof to block diffusion of copper, aluminum and oxygen.

A passivation layer 210 may be deposited on the top interconnect layer 206. In some embodiments, the passivation layer 210 may be formed of undoped silica glass (USG). In some embodiments, an etch stop layer (ESL) may be disposed between the passivation layer 210 and the top interconnect layer 206. Even though only one layer shown in FIG. 2A, the passivation layer 210 may include two or more layers. The ESL may include silicon carbon nitride (SiCN), silicon oxycarbide (SiOCN), silicon carboxide (SiC), or silicon nitride (SiN), or combinations thereof.

In some embodiments, a metal-insulator-metal (MIM) structure, such as the MIM structure 212 may be formed in the passivation layer 210. The MIM structure includes multiple metal layers interleaved with dielectric layers and functions as one or more capacitors. In some implementations, the multiple metal layers may include a top metal layer, a middle metal layer, and a bottom metal layer, each of which serves a capacitor plate. In some instances, to increase capacitance values, the dielectric layers in the MIM structure may include high-k dielectric material(s) whose k-value is greater than that of silicon dioxide. In some embodiments, the dielectric layers may include zirconium oxide ($ZrO_2$), aluminum oxide ($Al_2O_3$), or other high-k dielectric material, or a combination thereof.

The RDL features 214 are formed through and on the passivation layer 210. The RDL features 214 is configured to connect to provide electrical connections to the top conductors 208. In some embodiments, the RDL feature 214 includes a contact via 216 and a contact pad 218. In those embodiments, an opening 211 is first formed within the passivation layer 210 to expose a portion of the top conductor 208. When an MIM structure is formed, the contact via 216 penetrates through the MIM structure. The opening 211 may be formed by suitable photolithographic patterning process and etching. After the opening 211, photoresist and mask layer may be removed to expose the passivation layer 210 and the top conductor 208 at the bottom of the opening 211.

In some embodiments, a seed layer 215 is deposited on the passivation layer 210 including sidewalls of the opening 211, and the top conductor 208 at the bottom of the opening 211. In some embodiments, the seed layer 215 may be formed by a blanket deposition. For example, the seed layer 215 may be formed by physical vapor deposition. The seed layer 215 may be a conductive layer, such as a metal layer to subsequent deposition. The seed layer 215 may be a metal seed layer including copper, aluminum, titanium, alloys thereof, or multi-layers thereof. In some embodiments, the seed layer 215 includes a first metal layer such as a titanium layer and a second metal layer such as a copper layer over the first metal layer. In other embodiments, the seed layer 215 includes a single metal layer such as a copper layer, which may be formed of substantially pure copper or a copper alloy.

A photolithographically patterning process is then preformed to form a RDL pattern over the seed layer 215. The RDL pattern may expose areas of the seed layer 215 where the RDL features 214 are to be formed. The RDL features 214 are then formed by a suitable deposition process, for example electroplating, electroless plating, or other selective deposition processes. In some embodiments, the RDL features 214 include aluminum or an aluminum alloy. An example of the aluminum alloy includes aluminum and copper.

As shown in FIG. 2A, the RDL feature 214 included the contact via 216 formed in the passivation layer 210 and the contact pad 218 formed over the passivation layer 210. The contact via 216 connects to the contact pad 218. The contact pad 218 and the contact via 216 form a conductive path to the top conductor 208. Therefore, the RDL feature 214 including the contact via 216 is a functional RDL feature. In some embodiments, the semiconductor device 200 includes optional dummy RDL features 214a. The dummy RDL features 214a are configured to provide pattern density adjustment without connecting to any contact vias for electrical connection to the interconnect structure 204. In some embodiments, the dummy RDL features 214a may include contact pad 218a formed on the passivation layer 210.

After deposition of the RDL features 214, the patterned photoresist layer and the seed layer 215 underneath are removed to expose the passivation layer 210 below. As shown in FIG. 2A, after formation, the RDL features 214 and the optional dummy RDL features 214a if exist have a non-planar topography. For example, recesses 220 are formed over the contact vias 216, and trenches or gaps 222 are formed between neighboring RDL features 214, 214a. The RDL features 214, 214a has a top surface 218t. The recesses 220 and the gaps 222 dip below the top surface 218t. The non-planar topographical characteristics of the RDL features 214, 214a may be transferred to the subsequently deposited passivation layer and polyimide layers resulting in voids and non-planar surfaces. Embodiments of the present disclosure includes processing steps to eliminate voids and improve flatness of RDL layers.

Figure 2B:
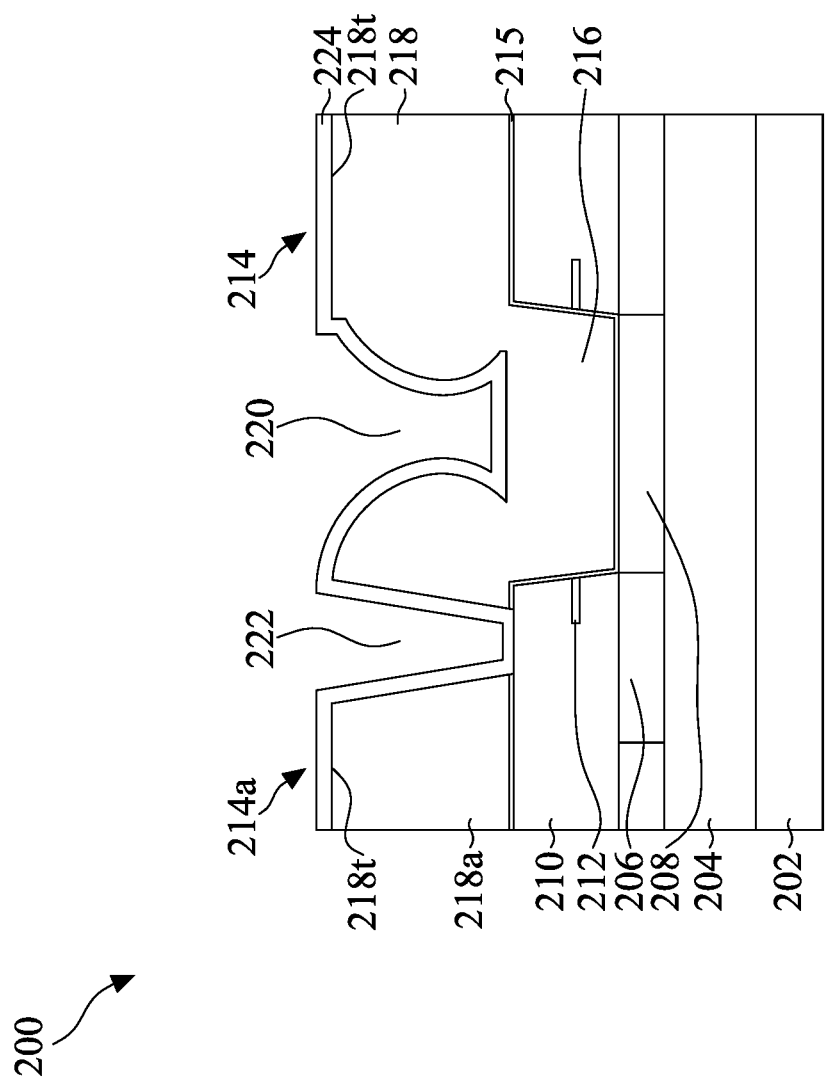

In operation 104 of the method, an etch stop layer 224 is deposited over the semiconductor device 200, as shown in FIG. 2B. The etch stop layer 224 may include one or more layers of dielectric material, such as silicon oxynitride (SiON), silicon nitride (SiN), silicon carbon nitride (SiCN), silicon oxycarbide (SiOCN), silicon carboxide (SiC), or combinations thereof. In some embodiments, the etch stop layer 224 includes a first sublayer comprising SiON and a second sublayer comprising SiN. The first sublayer is deposited on the RDL features 214 and the exposed passivation layer 210. In some embodiments, the first sublayer is a SiON layer having a thickness between about 100 angstroms and about 300 angstroms, for example about 200 angstroms. The second sublayer is deposited on the first sublayer. In some embodiments, the second sublayer is a SiN layer having a thickness between about 500 angstroms and about 1000 angstroms, for example about 750 angstroms.

Figure 2C:
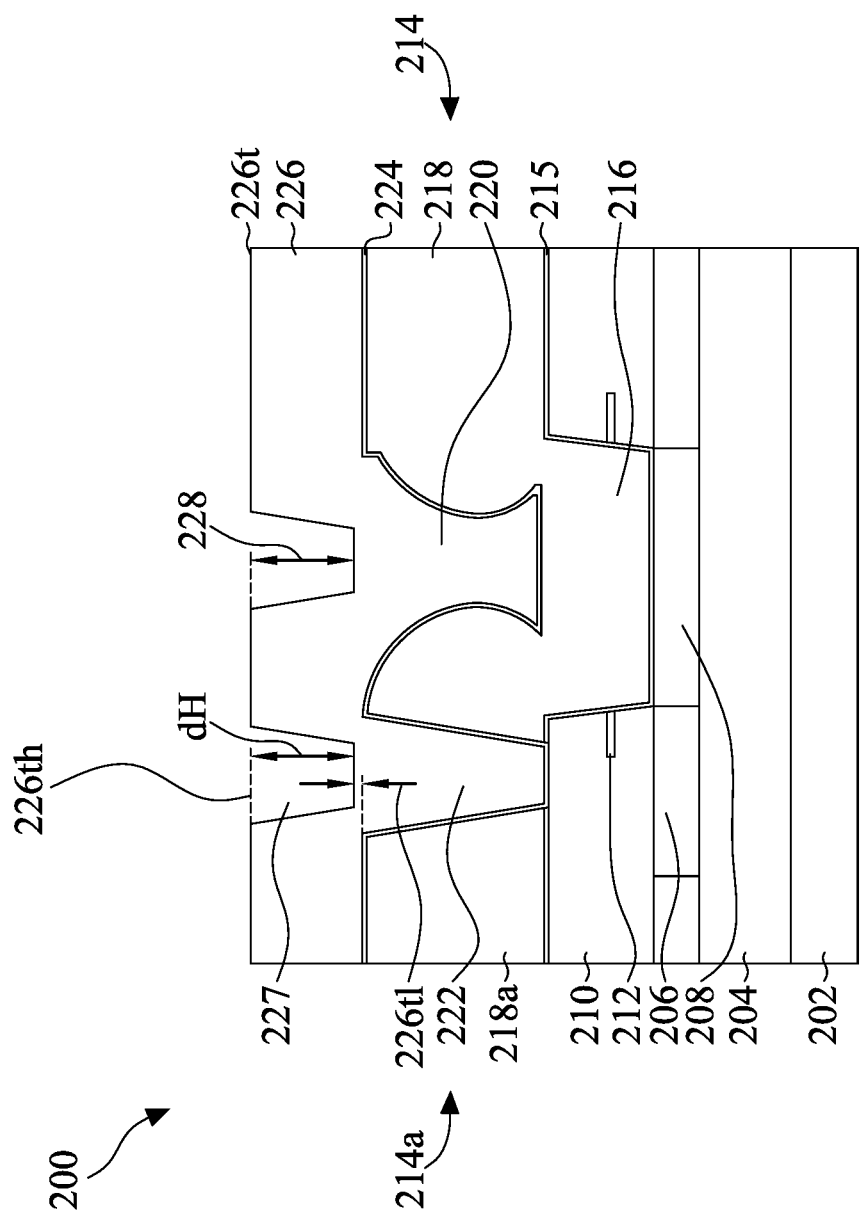

In operation 106 of the method 100, a first passivation layer 226 is deposited over the etch stop layer 224, as shown in FIG. 2C. The first passivation layer 226 may include one or more layers of silicon oxides or materials with similar properties of silicon oxide. After deposition of the first passivation layer 226, the gaps 222 between the RDL features 214 and the recesses 220 within the RDL features 214 are filled. As shown in FIG. 2C, the non-planar topographical characteristics of the RDL features 214 transfers to a top surface 226t of the first passivation layer 226. In some embodiments, the gaps 222 between the RDL features 214 and the recesses 220 within the RDL features 214 evolve into recesses 227 in the first passivation layer 226. In some embodiments, the recesses 227 may have a depth dH, which is defined by the vertical distance between a high point 226th of the top surface 226t and a low point 226tl of the top surface 226t.

In some implementations, the first passivation layer 226 may include two sublayers that are formed using two different deposition processes. In one embodiment, the first passivation layer 226 may include a bottom dielectric layer deposited on the etch stop layer 224 and a top dielectric layer deposited on the bottom dielectric layer. In some embodiments, the bottom dielectric layer may comprise undoped silica glass (USG) and the top dielectric layer may comprise silicon oxide formed by high-density plasma chemical vapor deposition (HDP-CVD). In some embodiments, the bottom dielectric layer may be USG having a thickness in a range between about 1500 angstroms and about 2500 angstroms, for example about 2000 angstroms. In some embodiments, the top dielectric layer may be HDP formed silicon oxide having a thickness in a range between about 20 k angstroms and about 35 k angstroms, for example about 27 k angstroms. In this arrangement, a deposition rate of the bottom dielectric layer or USG is greater than that the HDP-CVD process, thereby increasing throughput and reducing fabrication cost of the semiconductor device 200. Because the HDP-CVD process is more suitable for gap fill, the top dielectric layer is deposited to fill the gaps 222 between the RDL features 214 and the recesses 220 within the RDL features 214 without any voids.

Figure 2D:
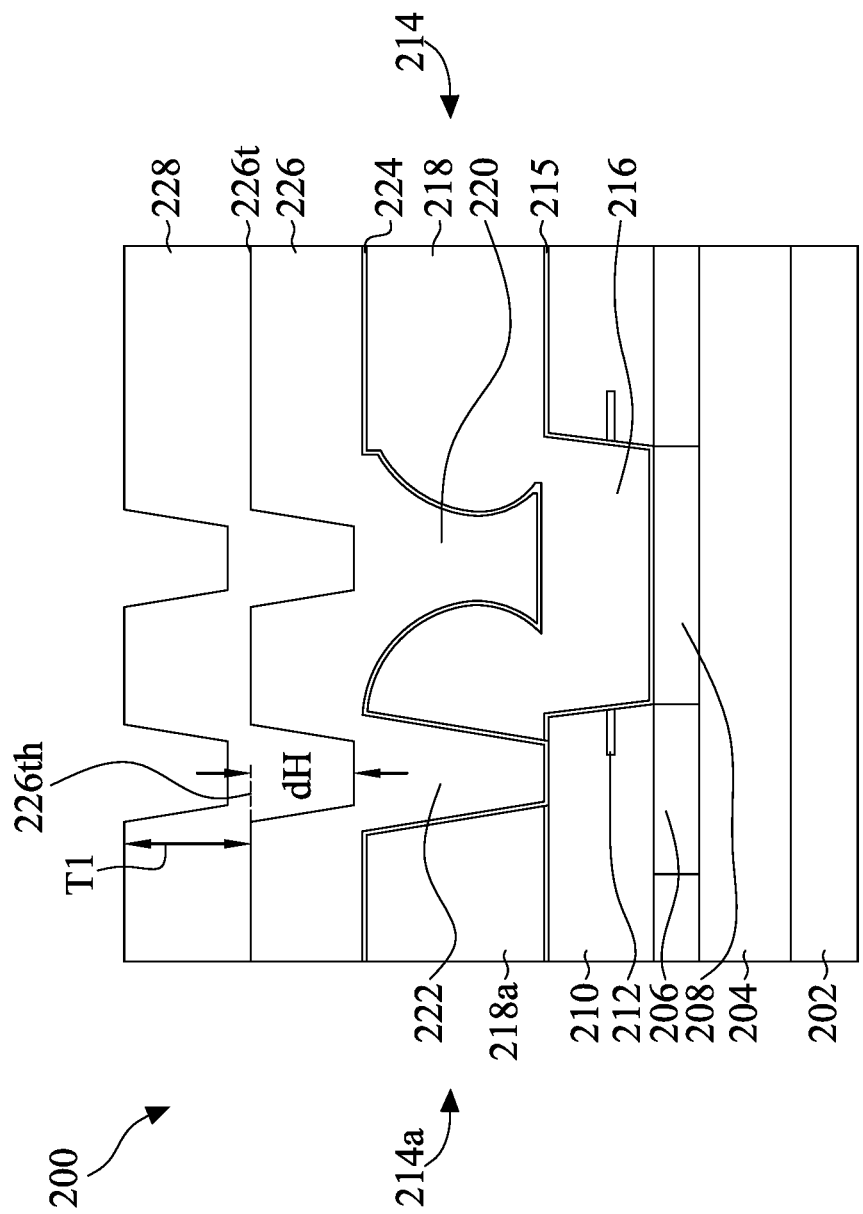

In operation 108 of the method, a sacrificial layer 228 is deposited over the first passivation layer 226, as shown in FIG. 2D. The sacrificial layer 228 is deposited over the first passivation layer 226 to provide additional thickness for an effective planarization process. In some embodiments, the sacrificial layer 228 may be a dielectric layer with similar polishing rate with the first passivation layer 226, or the top dielectric layer of the first passivation layer 226. In some embodiments, the sacrificial layer 228 comprises USG. Because the USG has a faster deposition rate than other silicon oxides, using the USG in the sacrificial layer 228 can improve throughput of the fabrication of the semiconductor device 200. Alternatively, the sacrificial layer 228 may be any suitable material.

The sacrificial layer 228 may have a thickness T1. In some embodiments, the thickness T1 of the sacrificial layer is greater than the depth dH of the recesses 227. The thickness T1 of the sacrificial layer 228 is between about 3 k angstroms and about 30 k angstroms, for example about 20 k angstroms. If the thickness T1 is thinner than 3 k angstroms, the recesses 227 in the first passivation layer 226 may not be able to fill up. If the thickness T1 is greater than 30 k angstroms, the sacrificial layer 228 may generate extra stress and cause undesirable warpage on the semiconductor device 200.

Figure 2E:
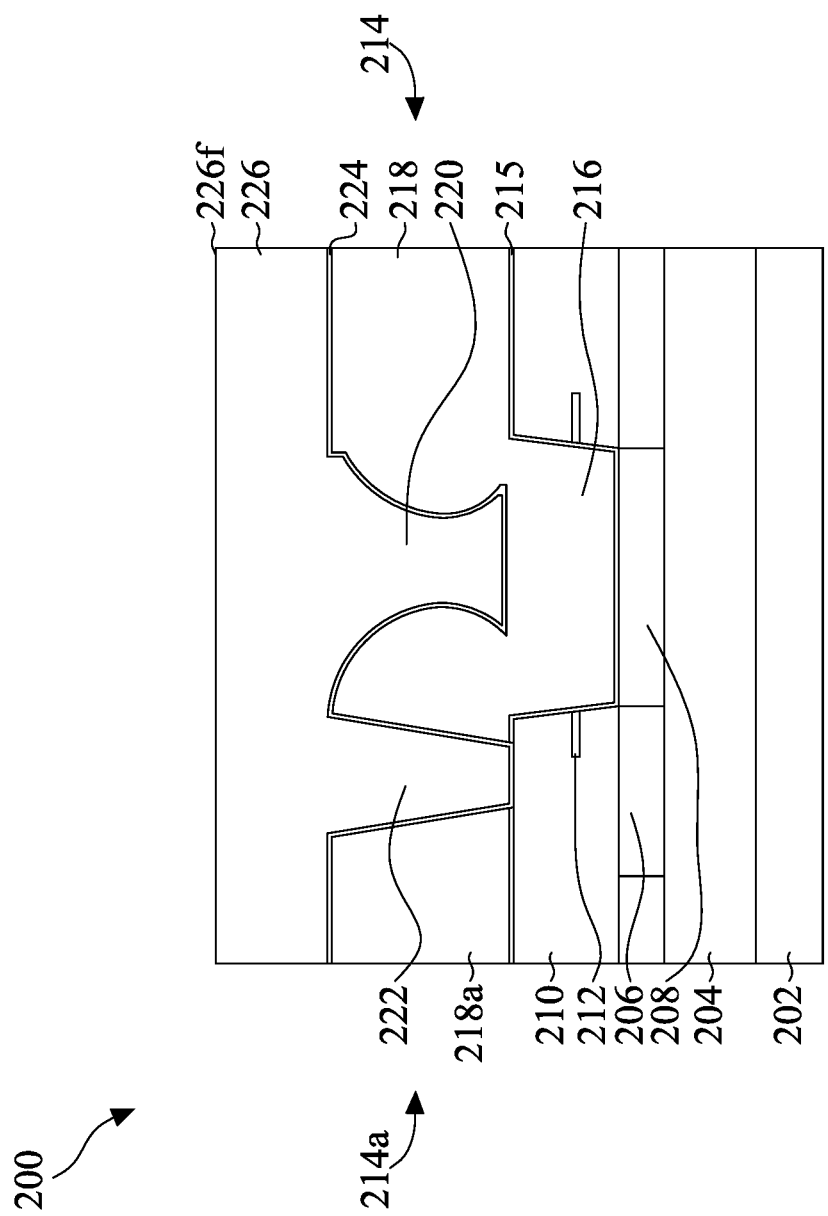

In operation 110 of the method 100, a planarization process, such as CMP, is performed to remove the sacrificial layer 228 and a portion of the first passivation layer 226 generating a flat surface 226f, as shown in FIG. 2E. In some embodiments, the CMP process may remove all the sacrificial layer 228. The sacrificial layer 228 ensures that the first passivation layer 226 has a flat surface 226f after CMP. In some embodiments, the CMP process may remove material in thickness in a range about 30 k angstroms and about 40 k angstroms, for example about 40 k angstroms. After the CMP process, the upper dielectric layer of the first passivation layer 226, i.e. the silicon oxide formed by HDP, may have a thickness between about 5 k angstroms and about 9 k angstroms. The flat surface 226f is comprised of silicon oxide formed by HDP.

Figure 2F:
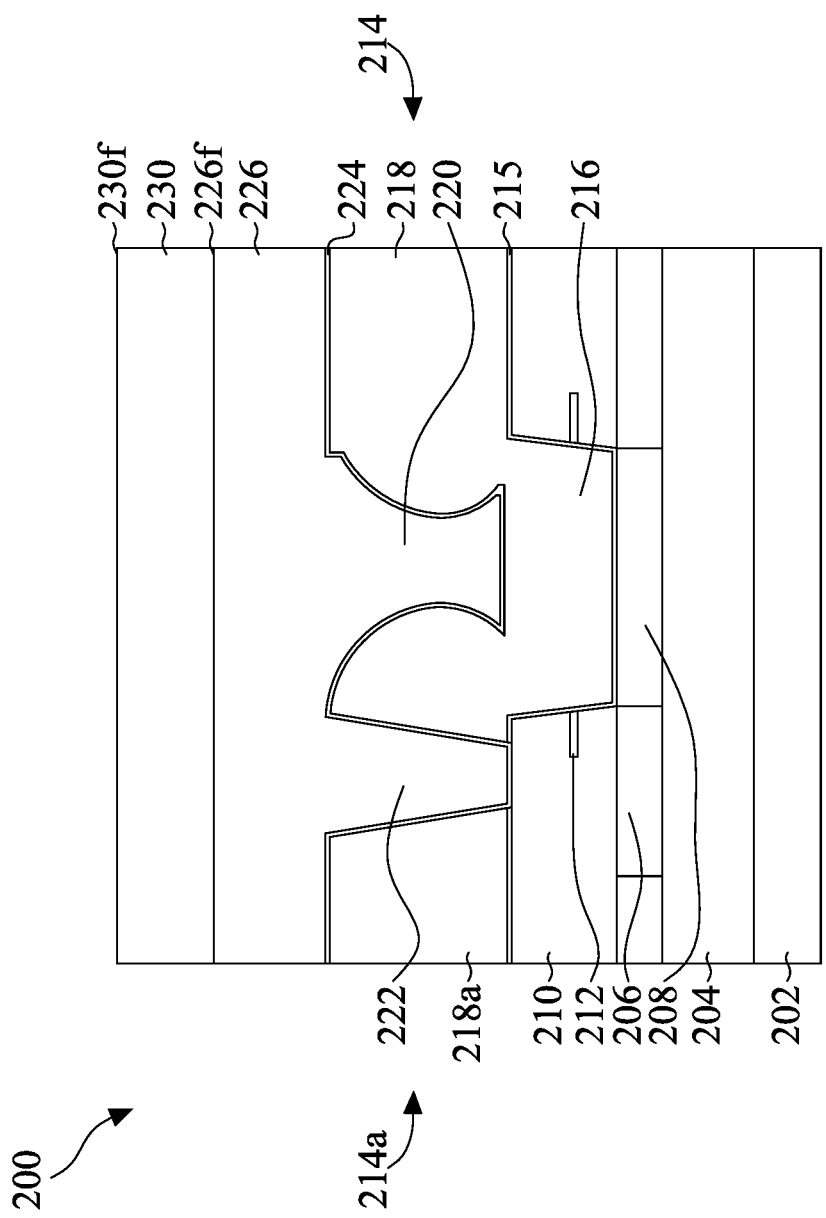

In operation 112 of the method 100, a second passivation layer 230 is deposited over the flat surface 226f of the first passivation layer 226, as shown in FIG. 2F. The second passivation layer 230 may include silicon nitride. The second passivation layer 230 may be formed using any suitable deposition process, for example CVD. As shown in FIG. 2F, the second passivation layer 230 has a substantially flat top surface 230f.

Figure 2G:
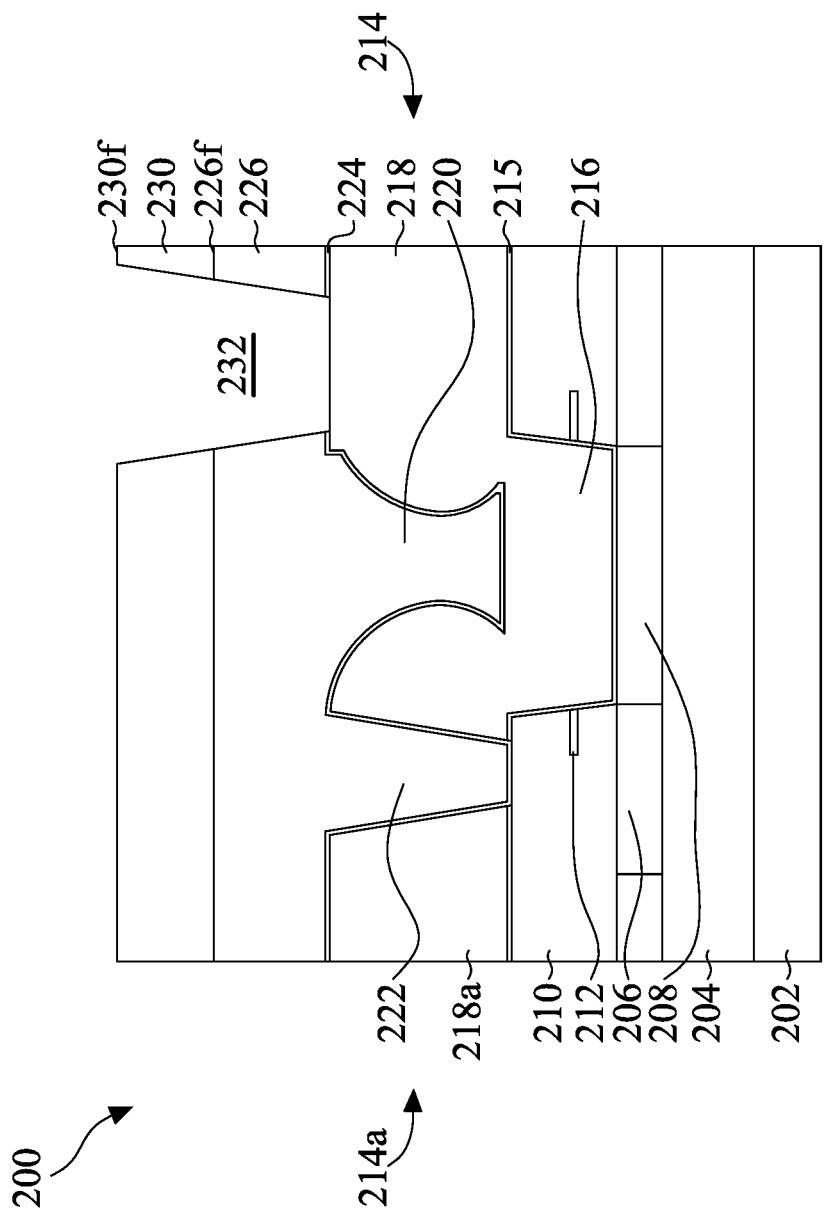

In operation 114 of the method 100, subsequent processes may be performed to form subsequent RDLs or to facilitate a packaging scheme that needs a flat top surface on the topmost passivation layer, as shown FIG. 2G. For example, an opening 232 may be formed through the second passivation layer 230, the first passivation layer 226, and the etch stop layer 224 to expose the contact pad 218 so that a contact via may be formed in the opening 232 for a second RDL feature.

Figure 3:
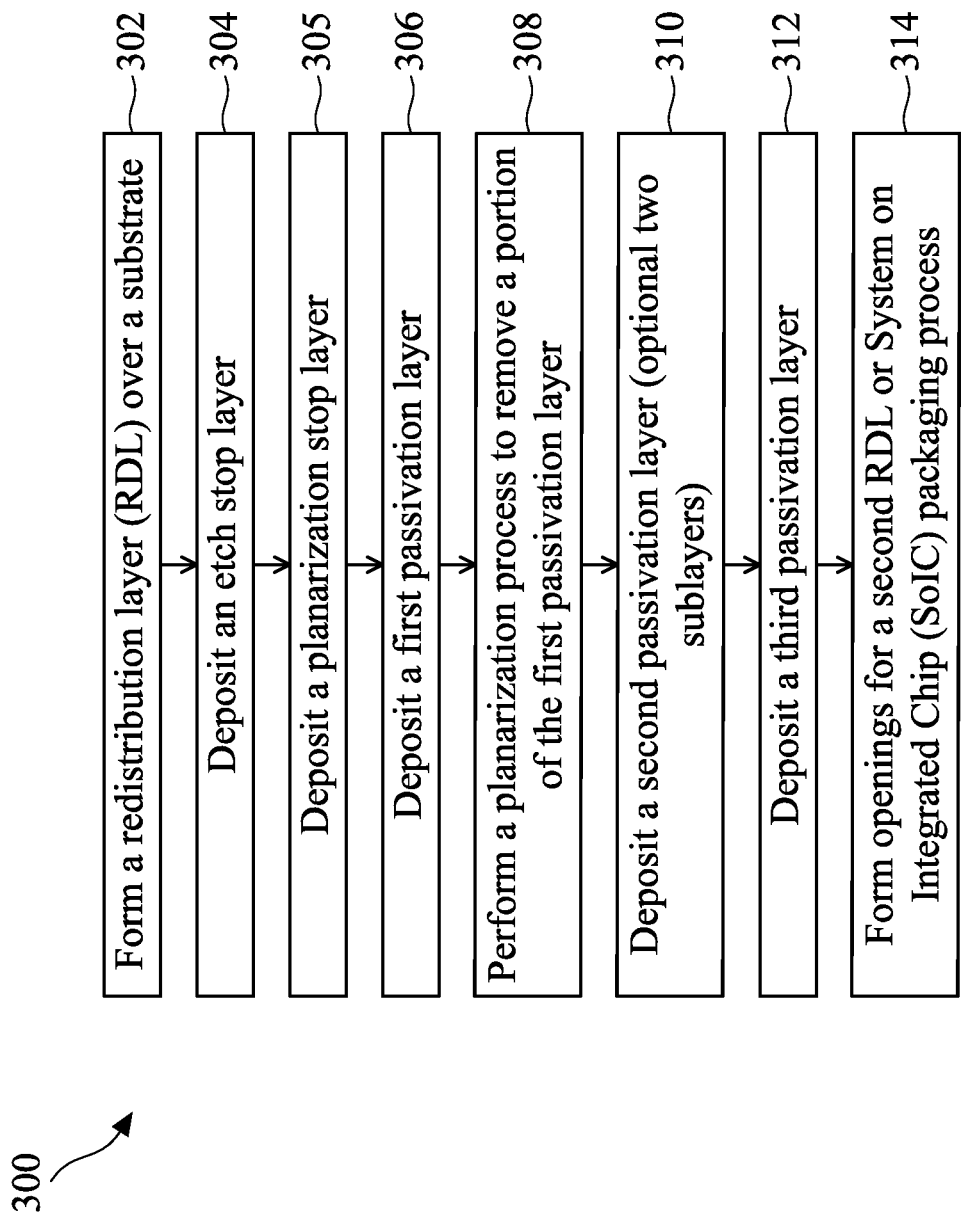
FIG. 3 is a flow chart of a method for fabricating a semiconductor device according to embodiments of the present disclosure.

FIG. 3 is a flow chart of a method 300 for fabricating a semiconductor device according to embodiments of the present disclosure. FIGS. 4A-4G are schematic cross-sectional views of a semiconductor device 400 at various stages of fabrication according to the method 300.

Figure 4A:
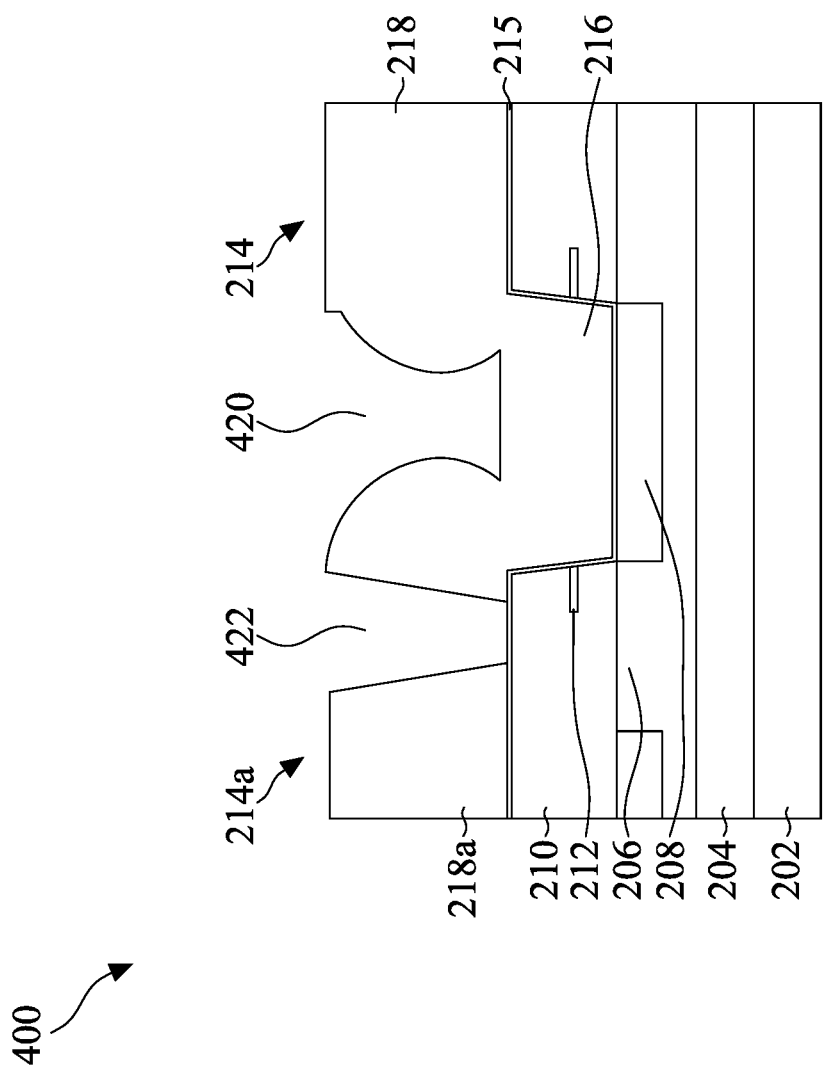
FIGS. 4A-4H are schematic cross-sectional views of a semiconductor device at various stages of fabrication according to embodiments of the present disclosure.

Operation 302 of the method 300 is similar to the operation 102 of the method 100, in which the RDL features 214 are formed over a substrate 202, as shown in FIG. 4A. As shown in FIG. 4A, the RDL feature 214 included the contact via 216 formed in the passivation layer 210 and the contact pad 218 formed over the passivation layer 210. The top surface 218t of the RDL features 214, 214a are non-planar including gaps 422 between neighboring RDL features and recesses 420 above the contact vias 216. The method 300 includes processing steps to eliminate voids and improve flatness of RDL layers.

Figure 4B:
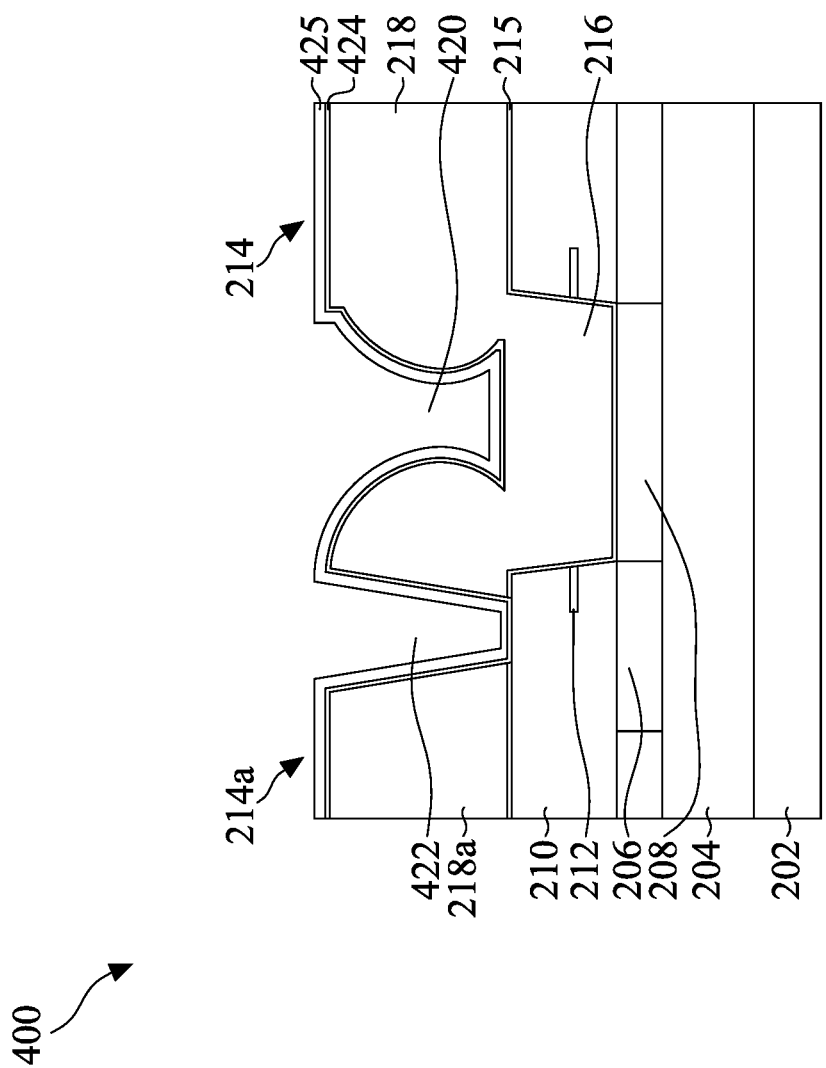

In operation 304 of the method 300, an etch stop layer 424 is deposited over the semiconductor device 400, as shown in FIG. 4B. The etch stop layer 424 is similar to the etch stop 242 of the semiconductor device 400. The etch stop layer 424 may include a first sublayer comprising SiON and a second sublayer comprising SiN. In some embodiments, the first sublayer is a SiON layer having a thickness between about 100 angstroms and about 300 angstroms, for example about 200 angstroms. The second sublayer is deposited on the first sublayer. In some embodiments, the second sublayer is a SiN layer having a thickness between about 500 angstroms and about 1000 angstroms, for example about 750 angstroms.

In operation 306 of the method 300, a CMP stop layer 425 is deposited over the etch stop layer 424, as shown in FIG. 4B. The CMP stop layer 425 may include material with a composition different from a passivation layer to be formed. The CMP stop layer 425 may be used to signal an end point during planarization of the passivation layer deposited above the CMP stop layer 425. In some embodiments, the CMP stop layer 425 may be selected from materials has high selectivity of polish rate relative to materials for passivation layer, such as silicon oxide formed by HDP and USG. The CMP stop layer 425 may be used to enable extra reduction of the passivation layer during CMP. In some embodiments, the CMP stop layer 425 may also be selected from suitable material including elements not included in the passivation layer to be polished.

In some embodiments, the CMP stop layer 425 may be a dielectric material, such as silicon nitride (SiN), silicon carbon nitride (SiCN), silicon carboxide (SiC), silicon oxycarbide (SiOCN), silicon oxynitride (SiON), or combinations thereof. In some embodiments, the CMP stop layer 425 is a SiN layer, which may be continuously disposed over the second sublayer of the etch stop layer 424, such that the CMP stop layer 425 and the second sublayer of the etch stop layer 424 are one combined SiN layer. In some embodiments, the combined SiN layer may have a thickness that is between 5 times and 10 times of the thickness of the first sublayer SiON of the etch stop layer 424. For example, the combined SiN layer may have a thickness between about 500 angstroms and about 3000 angstroms, for example about 2000 angstroms. If CMP stop layer 425 is thinner than 500 angstroms, the CMP stop layer 425 may not function as a stop layer. If CMP stop layer 425 is too thick, it will take extra time to over polish. An over polish operation is the CMP process performed after the CMP stop layer 425 is detected to ensure that all layers above the CMP stop layer 425 are removed. In other embodiments, the CMP stop layer 425 may include a material different from the etch stop layer 424.

Figure 4C:
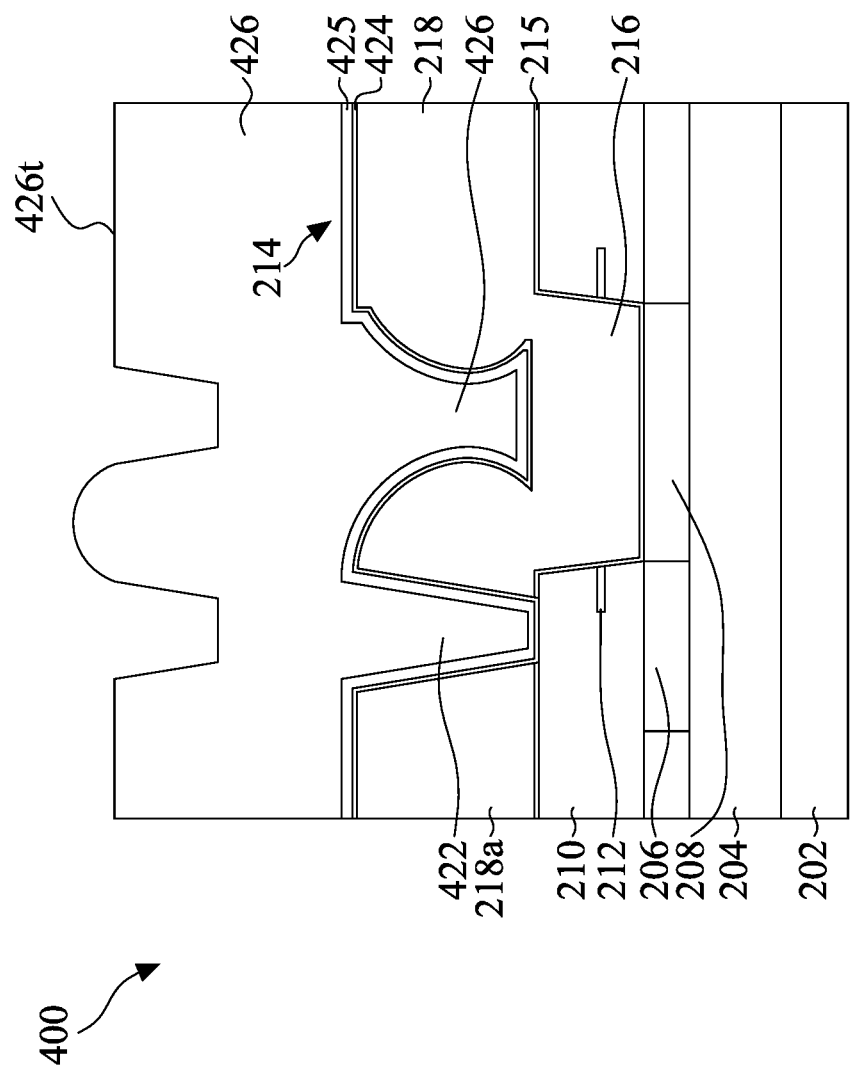

In operation 306 of the method 300, a first passivation layer 426 is deposited over the CMP stop layer 425, as shown in FIG. 4C. The first passivation layer 426 may include one or more layers of silicon oxides or materials with similar properties of silicon oxide. After deposition of the first passivation layer 426, the gaps 422 between the RDL features 214 and the recesses 420 within the RDL features 214 are filled. As shown in FIG. 4C, the non-planar topographical characteristics of the RDL features 214 transfers to a top surface 426t of the first passivation layer 426.

In some implementations, the first passivation layer 426 may include two sublayers that are formed using two different deposition processes. In one embodiment, the first passivation layer 426 may include a bottom dielectric layer 426b deposited on the CMP stop layer 425 and a top dielectric layer 426u deposited on the bottom dielectric layer 426b. In some embodiments, the bottom dielectric layer 426b may comprise undoped silica glass (USG) and the top dielectric layer may comprise silicon oxide formed by high-density plasma chemical vapor deposition (HDP-CVD). In some embodiments, the bottom dielectric layer 426b may be USG having a thickness in a range between about 1500 angstroms and about 2500 angstroms, for example about 2000 angstroms. In some embodiments, the top dielectric layer 426u may be HDP formed silicon oxide having a thickness in a range between about 20 k angstroms and about 35 k angstroms, for example about 27 k angstroms. In this arrangement, a deposition rate of the bottom dielectric layer 426b or USG is greater than that the HDP-CVD process, thereby increasing throughput and reducing fabrication cost of the semiconductor device 400. Because the HDP-CVD process is more suitable for gap fill, the top dielectric layer is deposited to fill the gaps 422 between the RDL features 214 and the recesses 420 within the RDL features 214 without any voids.

Figure 4D:
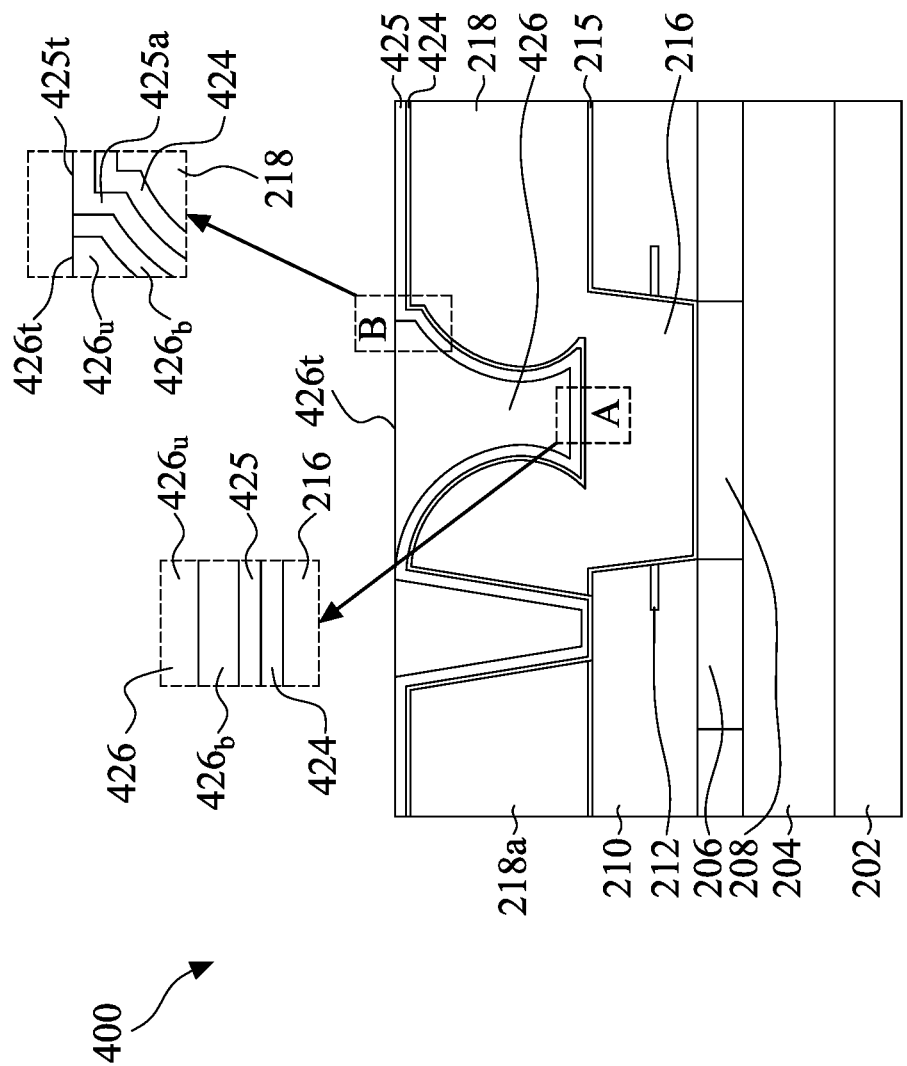

In operation 308 of the method 300, a planarization process, such as CMP, is performed to remove a portion of the first passivation layer 426 generating a flat surface 426f, as shown in FIG. 4D. In some embodiments, the CMP process ends when the CMP stop layer 425 is exposed by the CMP process. For example, when an indication of the CMP stop layer 425 is exposed by the CMP process, the CMP process stops. An exemplary indication may be a representative element, such as nitrogen, from the CMP stop layer 425 shows up in consumed polishing slurry at certain concentration. After operation 308, the top surface of the semiconductor device 400 includes the top surface 425t the CMP stop layer 425 and the top surface 426t of the first passivation layer 426. The top surfaces 425t and 426t form a substantially flat surface. The CMP stop layer 425 prevents the RDL features 214 from being removed by the CMP process and enables a flat surface. Because a portion of the CMP stop layer 425 disposed over the contact pads 218 may be removed, therefore, the CMP stop layer 425 is thinner above the contact pads 218 and thicker above the contact vias 216.

Region A at the bottom of the recess 420 is enlarged to show the various layers therein. In region A, the etch stop layer 424 is disposed over the contact via 216; the CMP stop layer 425 with a full thickness is disposed over the etch stop layer 424; the bottom dielectric layer 426b is disposed over the CMP stop layer 425; and the top dielectric layer 426u is disposed on the bottom dielectric layer 426b.

Region B at a top corner of the recess 420 is enlarged to show the various layers therein. In region B, the etch stop layer 424 is disposed over the contact pad 218; the CMP stop layer 425 with a full thickness is disposed over the etch stop layer 424 on the sidewall of the recess 420; the CMP stop layer 425 with partial thickness is disposed over the etch stop layer 424 on horizontal surface; the bottom dielectric layer 426b is disposed over the CMP stop layer 425 on the sidewall of the recess 420; the CMP stop layer 425 is exposed on the horizontal surface; and the top dielectric layer 426u is disposed on the bottom dielectric layer 426b in the recess 420.

Figure 4E:
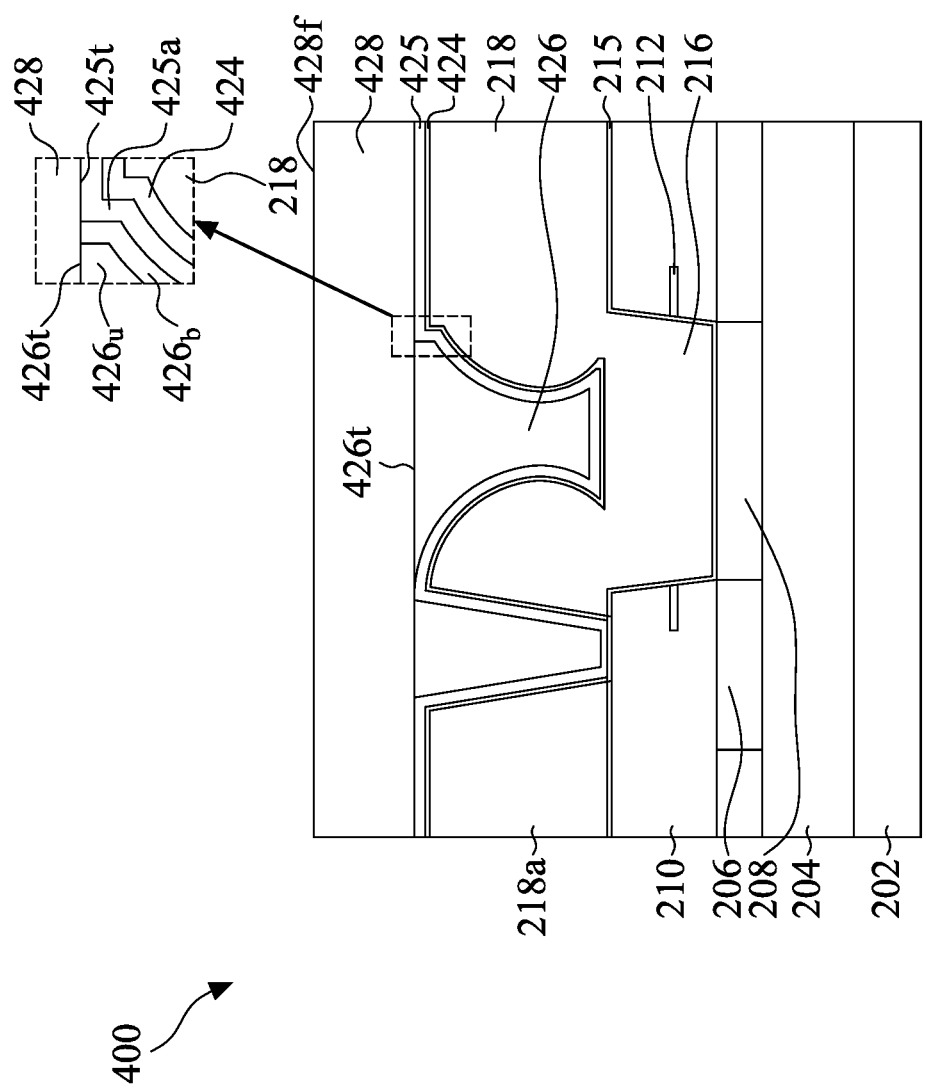

In operation 310 of the method 300, a second passivation layer 428 is deposited over the flat surface 426f of the first passivation layer 426 and the flat surface area 425t, as shown in FIG. 4E. The second passivation layer 428 may comprise USG deposited of a target thickness. Region B in FIG. 4E is enlarged to show the various layers at the top corner of the recess 420. In region B after operation 310, the second passivation layer 428 is in contact with the CMP stop layer 425 above the contact pad 218, in contact with the etch stop layer 424 and the bottom dielectric layer 426b at edges or boundaries of the recess 420 (or the gaps 422), and in contact with the top dielectric layer 426u over the recess 420 (or the gaps 422). The second passivation layer 428 also has a substantially flat top surface 428f.

Figure 4F:
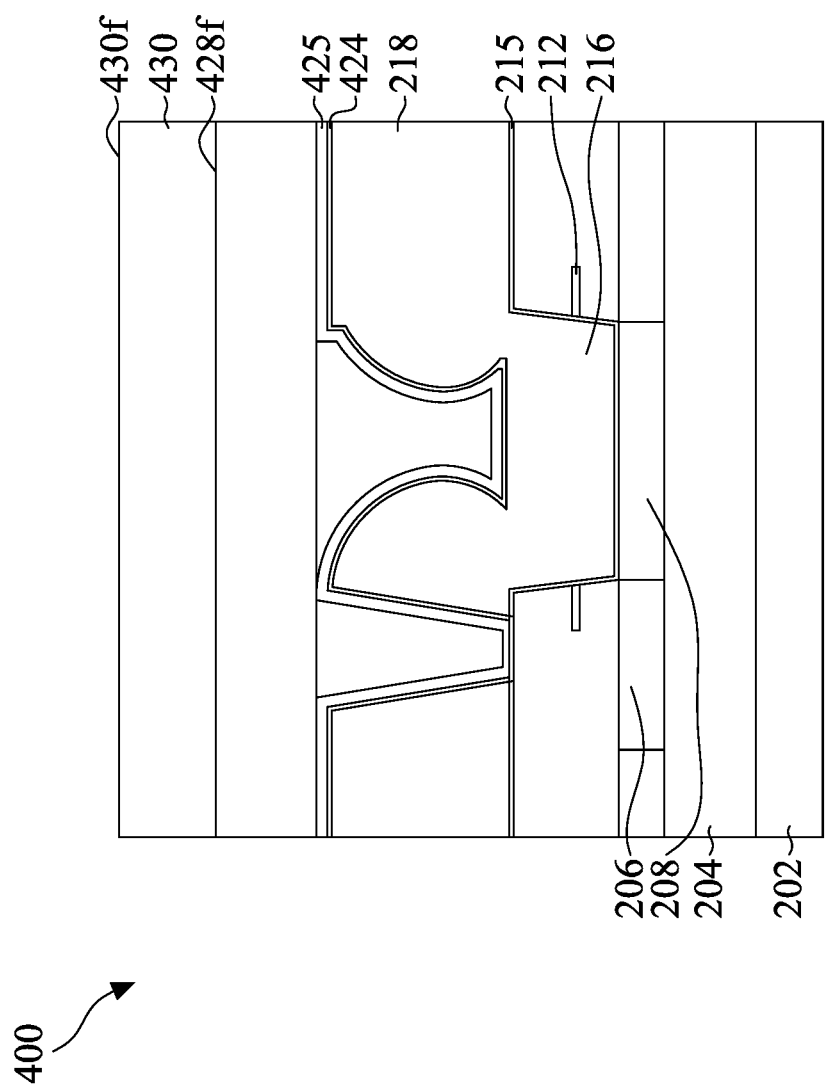

In operation 312 of the method 300, a third passivation layer 430 is deposited over the flat surface 228f of the second passivation layer 226, as shown in FIG. 4F. The third passivation layer 430 may include silicon nitride. The third passivation layer 430 may be formed using any suitable deposition process, for example CVD. As shown in FIG. 4F, the third passivation layer 430 has a substantially flat top surface 430f.

Figure 4G:
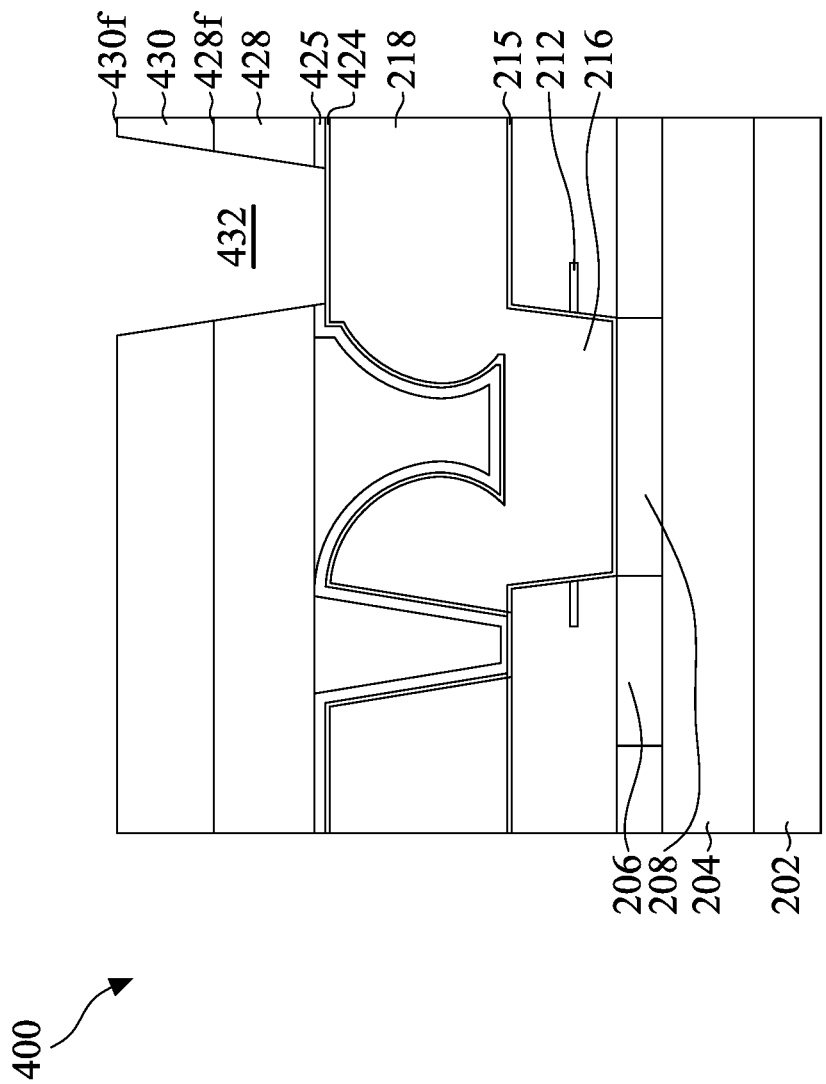

In operation 314 of the method 300, subsequent processes may be performed to form subsequent RDLs or to facilitate a packaging scheme that needs a flat top surface on the topmost passivation layer, as shown in FIG. 4G. For example, an opening 432 may be formed through the third passivation layer 430, the second passivation layer 428, the CMP stop layer 425 and the etch stop layer 424 to expose the contact pad 218 so that a contact via may be formed in the opening 432 for a second RDL feature.

Figure 4H:
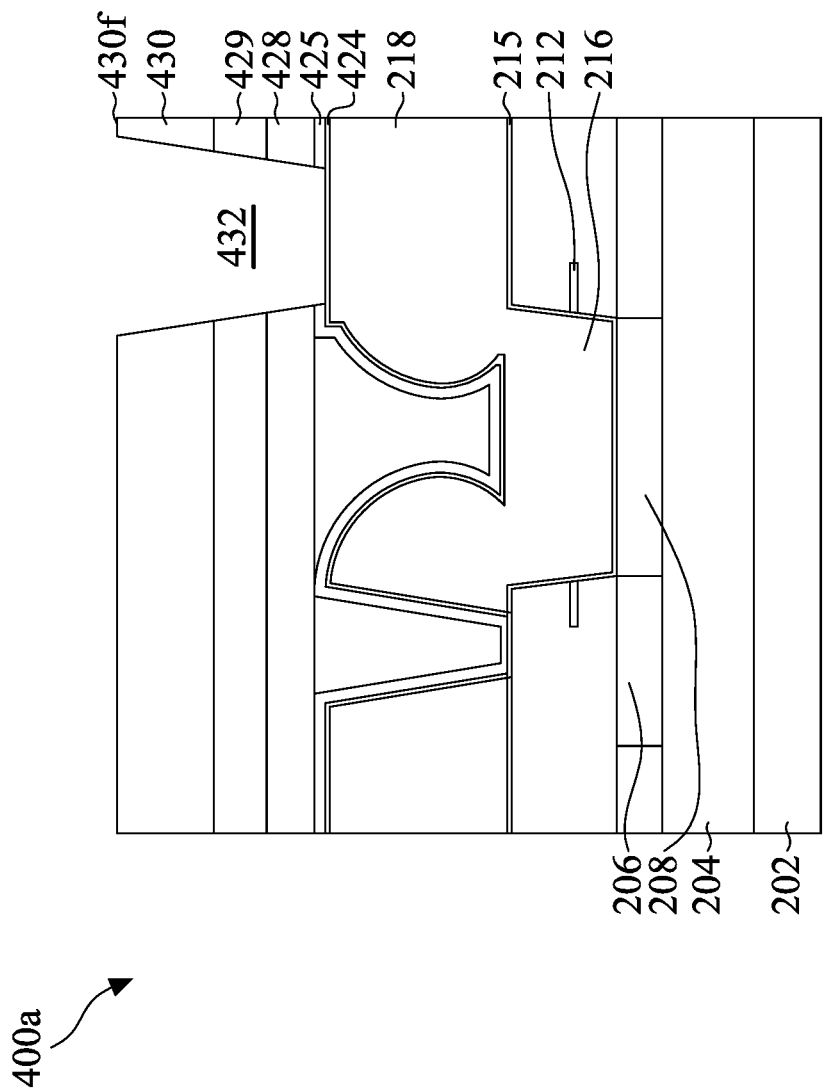

In some embodiments, an optional the fourth passivation layer 429 may be disposed between the second passivation layer 428 and the third passivation layer 430, as shown in FIG. 4H. In some embodiments, the fourth passivation layer 429 may be HDP formed silicon oxide deposited by HDP-CVD process.

Figure 5:
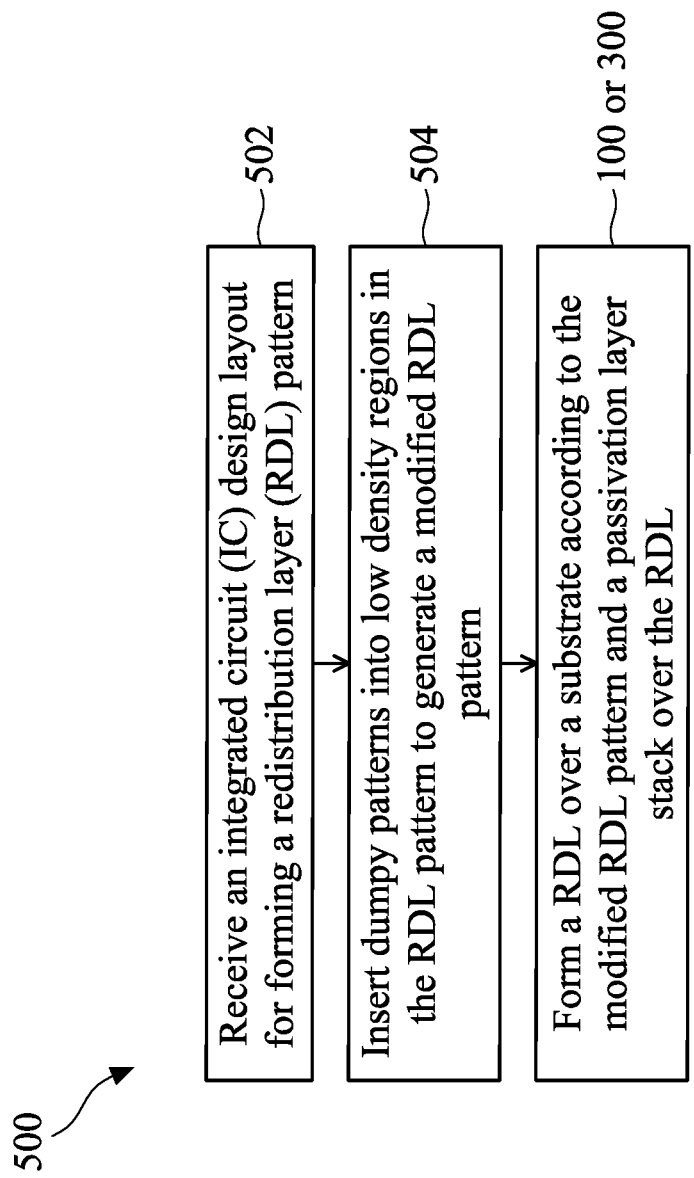
FIG. 5 is a flow chart of a method for fabricating a semiconductor device according to embodiments of the present disclosure.
Figure 6A:
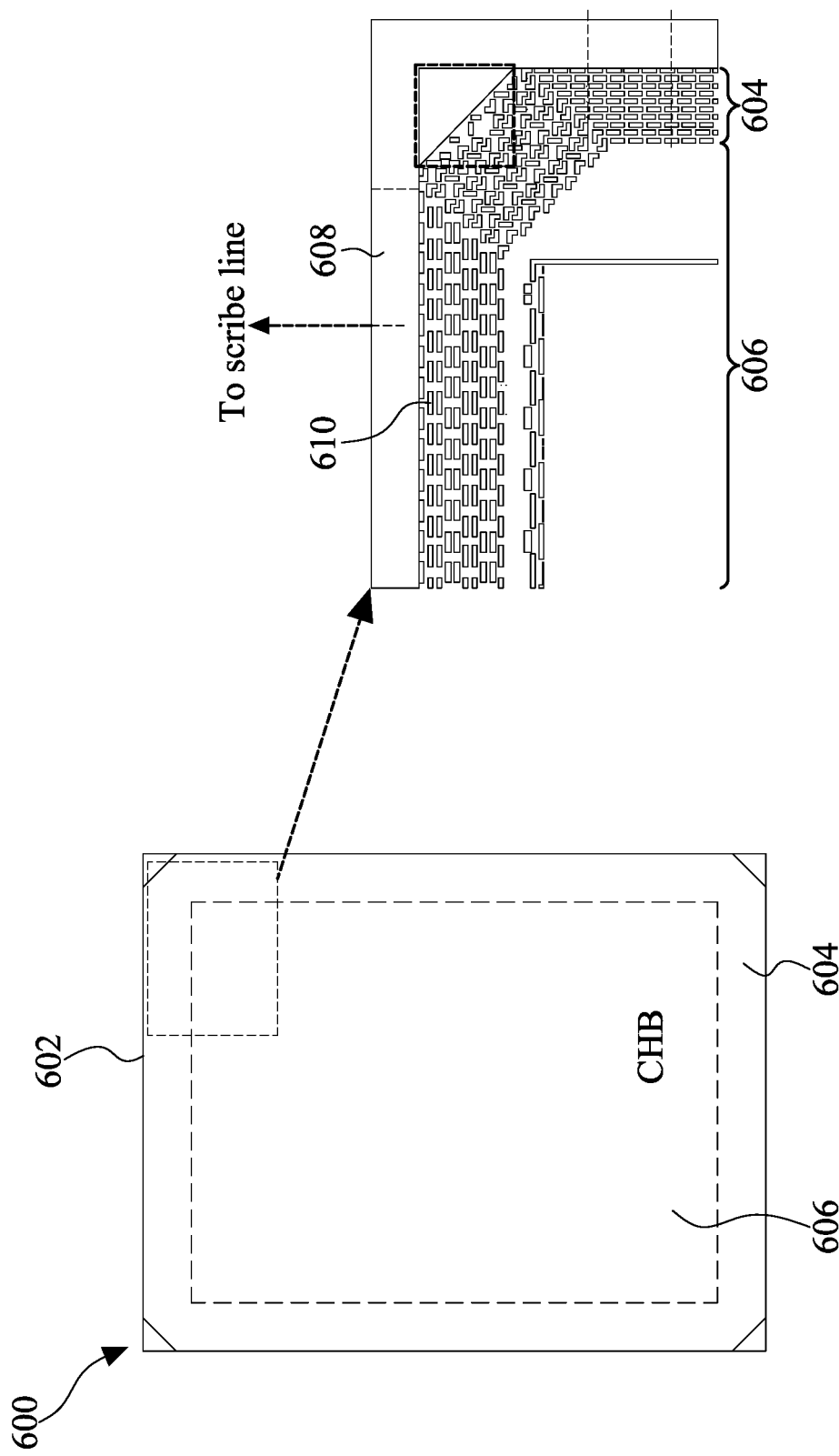
FIG. 6A is a schematic plan view of a main RDL pattern of a semiconductor device.

FIG. 5 is a flow chart of a method 500 for fabricating a semiconductor device according to embodiments of the present disclosure. The method 500 may be used to fabricate RDL structures with reduced pattern loading and improved process uniformity. FIGS. 6A-6B are schematic plan views of a semiconductor device 600 at various stages of fabrication according to the method 500.

In operation 502 of the method 500, receive and analyze an IC design layout for pattern modification, as shown in FIG. 6A. In the example, the ID design layout is a redistribution layer (RDL) pattern. It should be noted that the ID design layout may be a pattern of any layer where pattern loading may need improvement. FIG. 6A schematically a circuit region 602 for a single IC chip. During fabrication, a plurality of the circuit regions 602 may be arranged on a semiconductor substrate to be manufactured together. The plurality of circuit regions 602 may be separated from each other by scribe lines.

In some embodiments, pattern density and/or pattern density uniformity of the circuit region 602 may be calculated to determine if pattern modification is needed. Pattern density refers to a metric that measures how much of design features presented in a unit area. Pattern density may be calculated according to certain formula from characteristics of pattern objects, for example, width, length, spacing, shape, and other characters of pattern objects within a circuit area. Depending on the circuit design of the IC chip and individual layers, pattern objects may be non-uniformly distributed across a circuit region, causing process non-uniformity due to pattern density variation.

In the example of FIG. 6A, RDL pattern objects 610 are non-uniformly distributed in the circuit region 602. In some embodiments, in operation 502, the circuit region 602 may be divided into different regions according to pattern density. For example, the circuit region 602 may be divided to a first region 604 with a higher pattern density and a second region 606 with a lower pattern density. Pattern densities of individual regions, such as the first regions 604 and the second region 606 may be calculated. Additionally, overall pattern density of the circuit region 602 may be calculated from the pattern densities of the individual regions.

In operation 504 of the method 500, a modified pattern may be generated when the overall pattern density and/or variation of the individual pattern densities is not within a predetermined range. As shown in FIG. 6B, a modified pattern may be generated by inserting dummy pattern objects 612 to adjust the overall pattern density in the circuit region 602 and/or to reduce variation among pattern densities of the individual regions 604, 606. In some embodiments, the dummy pattern objects 612 are inserted into regions with low pattern density so that pattern density in all regions are in a range between about 50% and about 70%. The dummy pattern objects 612 may be used to form circuit objects with no function. For example, the dummy pattern objects 612 may be used to form dummy contact pads in the RDL structure, such as the contact pads 218a in the semiconductor devices 200, 400. The dummy contact pads are not electrically connected to underlying contact features, therefore, do not affect circuit function of the IC chip. The pattern objects 610 are connected to underlying contact features as part of the circuit design.

In some embodiments, the dummy pattern objects 612 may be inserted into regions with low pattern density, for example, the second region 606. Dimensions, shapes, spacings, orientation, and arrangement of the dummy pattern objects 612 may be selected to achieve a target overall pattern density and/or improve pattern density uniformity. In some embodiments, the dummy pattern objects 612 may be contact pads having a width in a range between about 0.5 micron and about 10 microns, and a length in a range between about 20 micron and about 200 microns. In some embodiments, spacings between the dummy pattern objects 612 may be in a range between about 0.5 micron and about 10 microns.

In some embodiments, the orientation of the dummy pattern objects 612 may be arranged to balance the RDL pattern objects 610 and/or dummy pattern objects 612 nearby. Balancing orientations of the dummy pattern objects 612 and the RDL pattern objects 610 may reduce warpage on the IC chip and the substrate.

If there is only horizontal or vertical pattern objects 610, 612, a warpage may occur on chip. Therefore, it is desirable to insert both horizontal and vertical dummy pattern objects 612 to balance warpages on the vertical and horizontal directions. Horizontally arranged dummy pattern objects 612 may be used control the warpage along the vertical direction and vertically arranged dummy pattern objects 612 may be used to control the warpage along horizontal direction. In some embodiments, regions with horizontally arranged dummy pattern objects 612 and regions with vertically arranged dummy pattern objects 612 are alternately disposed. Furthermore, the direction of dummy pattern objects 612 may coordinate with the direction of the functional RDL pattern objects 610 to balance warpage. For example, when the RDL pattern objects 610 are arranged vertically, the dummy pattern objects 612 may be arranged along the horizontal direction to prevent warpage in the substrate.

In operation 506 of the method 500, a RDL structure may be fabricated using the modified pattern. The RDL structure may be fabricated using any suitable process sequence. In some embodiments, the RDL structure may have a flat surface using the method 100 or 300 of the present disclosure.

After inserting the dummy pattern objects 612 and functional pattern objects 610 are formed in same RDL layer and formed simultaneously using same photomask. In some embodiments, the material of dummy pattern objects 612 are the same as the material of functional pattern objects 610, such as AlCu. Alternatively, the dummy pattern objects 612 may be formed from other conductive materials.

The RDL structure fabricated with the method 100, 300 has a flat surface and without voids in the passivation layers, thus, eliminating pin hole test failures. The RDL structure using modified pattern with inserted dummy pattern objects may reduce pattern loading during process. When the pattern density in all regions is between 50% and 70%, pattern loading during CMP process may be reduced to a target range. For CMP process, pattern loading may refer to surface height differences between wafer center and wafer edge.

Figure 6C:
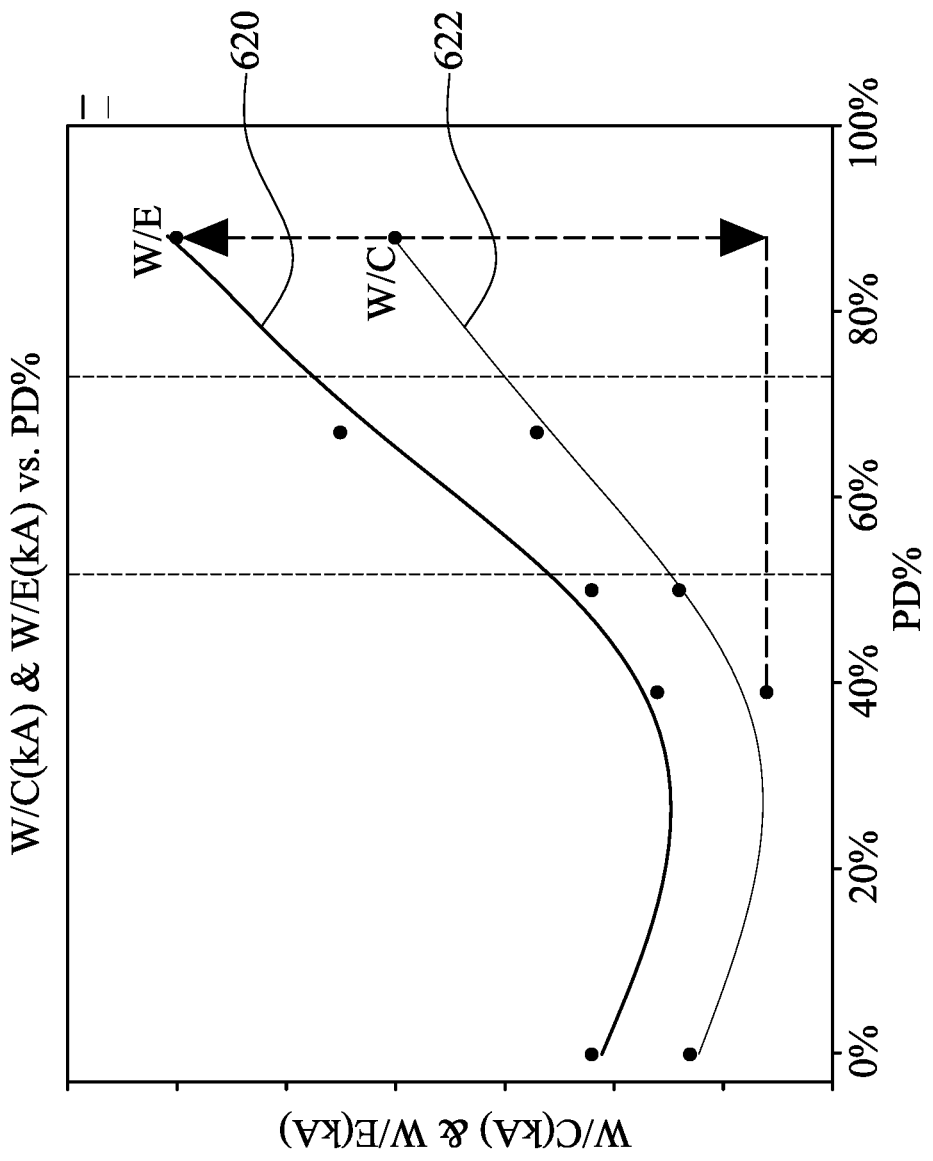
FIG. 6C is a schematic plot showing pattern loading under different pattern densities.

FIG. 6C is a schematic plot showing pattern loading under different pattern densities. In FIG. 6C, curve 620 indicates surface heights at wafer edge after a CMP process under different pattern densities, and curve 622 indicates surface heights at wafer center after the CMP process under different pattern densities. When the pattern loading is a range between about 50% and about 70%, the pattern loading is reduced to lower than 3 k angstrom. Because the pattern loading is reduced, e.g., from 5 k angstroms to 3 k angstrom, the thickness difference between layers in different regions is reduced. When openings for contact vias are formed in layers of different regions, difference between needed etching depths of the openings for the contact vias is also reduced, therefore, resulting in a larger etching window. The larger etching window can provide better etching process performance, and the recess filling of the contact vias r following the etching process is more uniform. Therefore, resistance of the contact vias may be reduced and performance of the RDL structures is improved.

Various embodiments or examples described herein offer multiple advantages over the state-of-art technology. By using a CMP stop layer or extra thickness in the passivation prior CMP process, embodiments of the present disclosure reduce void formation in passivation layer, eliminating pin hole test failures. By inserting dummy pattern objects to a RDL pattern, embodiments of the present disclosure eliminate CMP pattern loading, increasing etching window of passivation layer, and reducing contact via resistance.

It will be understood that not all advantages have been necessarily discussed herein, no particular advantage is required for all embodiments or examples, and other embodiments or examples may offer different advantages.

Some embodiments of the present disclosure provide a method for fabricating a semiconductor device, comprising: forming a RDL redistribution layer (RDL) feature in and above a first dielectric layer, wherein the RDL feature comprises: a contact via disposed within the first dielectric layer; and a contact pad in connection with the contact via above the first dielectric layer, wherein a recess is formed with the contact pad and above the contact via; depositing a chemical mechanical polishing (CMP) stop layer over the RDL feature and the first dielectric layer; depositing a first passivation layer over the CMP stop layer, wherein the first passivation layer fills the recess; polishing the first passivation layer to expose the CMP stop layer; and depositing a second passivation layer over the first passivation layer and the CMP stop layer.

Some embodiments of the present disclosure provide a method for fabricating a semiconductor device, comprising forming a RDL redistribution layer (RDL) feature in and above a first dielectric layer, wherein the RDL feature comprises a contact via disposed within the first dielectric layer; and a contact pad in connection with the contact via above the first dielectric layer, wherein a first recess is formed next to the contact pad; depositing a first passivation layer over the RDL feature, wherein the first passivation layer fills the first recess, and a second recess is formed in the first passivation layer above the first recess; depositing a sacrificial passivation layer on the first passivation layer, wherein the sacrificial passivation layer fills the second recess; removing the sacrificial passivation layer and a portion of the first passivation layer by polishing; and depositing a second passivation layer over the first passivation layer.

Some embodiments of the present disclosure provide a semiconductor device, comprises a first dielectric layer; a RDL redistribution layer (RDL) feature disposed in and above the first dielectric layer, wherein the RDL feature comprises a contact via disposed within the first dielectric layer; and a contact pad in connection with the contact via above the first dielectric layer, wherein a first recess is formed in the contact pad above the contact via; a CMP stop layer disposed on the RDL feature; and a first passivation layer disposed in the first recess and on a first portion of the CMP stop layer; and a second passivation layer disposed on the first passivation layer and a second portion of the CMP stop layer, wherein the first portion of the CMP stop layer has a first thickness, the second portion of the CMP stop layer has a second thickness, and the first thickness is greater than the second thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a semiconductor device, comprising:
   forming a RDL redistribution layer (RDL) feature in and above a first dielectric layer, wherein the RDL feature comprises:
      a contact via disposed within the first dielectric layer; and
      a contact pad in connection with the contact via above the first dielectric layer, wherein a recess is formed with the contact pad and above the contact via;
   depositing a chemical mechanical polishing (CMP) stop layer over the RDL feature and the first dielectric layer;
   depositing a first passivation layer over the CMP stop layer, wherein the first passivation layer fills the recess;
   polishing the first passivation layer to expose the CMP stop layer; and
   depositing a second passivation layer over the first passivation layer and the CMP stop layer.

2. The method of claim 1, further comprising:
   depositing an etch stop layer on the RDL feature prior to depositing the CMP stop layer.

3. The method of claim 2, wherein depositing the etch stop layer comprises:
   depositing a first sublayer formed on the RDL feature; and
   depositing a second sublayer formed on the first sublayer.

4. The method of claim 3, wherein depositing the CMP stop layer comprises continuously depositing a material of the second sublayer.

5. The method of claim 4, wherein the first sublayer has a first thickness, the CMP stop layer and the second sublayer has a second thickness together, and the second thickness is in a range between 5 times to 10 times of the first thickness.

6. The method of claim 1, further comprising forming a dummy feature simultaneously with the RDL feature.

7. The method of claim 1, wherein depositing the second passivation layer comprises:
   depositing a silicon oxide layer by high-density plasma (HDP) deposition.

8. The method of claim 7, wherein depositing the second passivation layer further comprises:

depositing a undoped silica glass (USG) layer on the silicon oxide layer.

9. A method for fabricating a semiconductor device, comprising:
  forming a RDL redistribution layer (RDL) feature in and above a first dielectric layer, wherein the RDL feature comprises:
    a contact via disposed within the first dielectric layer; and
    a contact pad in connection with the contact via above the first dielectric layer, wherein a first recess is formed next to the contact pad;
  depositing a first passivation layer over the RDL feature, wherein the first passivation layer fills the first recess, and a second recess is formed in the first passivation layer above the first recess;
  depositing a sacrificial passivation layer on the first passivation layer, wherein the sacrificial passivation layer fills the second recess;
  removing the sacrificial passivation layer and a portion of the first passivation layer by polishing; and
  depositing a second passivation layer over the first passivation layer.

10. The method of claim 9, wherein the first recess has a first depth, the sacrificial passivation layer has a first thickness, and a ratio of the first thickness over the first depth is greater than 2:1.

11. The method of claim 10, wherein the sacrificial passivation layer comprises USG.

12. The method of claim 11, wherein depositing the first passivation layer comprises:
  depositing a first sublayer comprising USG; and
  depositing a second sublayer comprising silicon oxide formed by HDP deposition.

13. The method of claim 9, further comprising forming a dummy feature simultaneously with the RDL feature.

14. The method of claim 13, further comprising:
  generating a modified RDL pattern by inserting dummy pattern objects to a RLD pattern.

15. The method of claim 14, wherein the modified RDL pattern has a pattern density between about 50% and about 70%.

16. A semiconductor device, comprises:
  a first dielectric layer;
  a RDL redistribution layer (RDL) feature disposed in and above the first dielectric layer, wherein the RDL feature comprises:
    a contact via disposed within the first dielectric layer; and
    a contact pad in connection with the contact via above the first dielectric layer, wherein a first recess is formed in the contact pad above the contact via;
  a CMP stop layer disposed on the RDL feature; and
  a first passivation layer disposed in the first recess and on a first portion of the CMP stop layer; and
  a second passivation layer disposed on the first passivation layer and a second portion of the CMP stop layer, wherein the first portion of the CMP stop layer has a first thickness, the second portion of the CMP stop layer has a second thickness, and the first thickness is greater than the second thickness.

17. The semiconductor device of claim 16, further comprising an etch stop layer disposed between the RDL feature and the CMP stop layer.

18. The semiconductor device of claim 17, wherein the etch stop layer has a third thickness, and the first thickness is in a range between 5 times to 10 times of the third thickness.

19. The semiconductor device of claim 18, wherein the CMP stop layer comprises SiN and the etch stop layer comprises SiON.

20. The semiconductor device of claim 16, wherein the first passivation layer comprises silicon oxide formed by HDP deposition, and the second passivation layer comprises USG.

* * * * *